United States Patent
Fernandez

(10) Patent No.: US 7,443,206 B1
(45) Date of Patent: Oct. 28, 2008

(54) HIGH-FREQUENCY LINEAR PHASE-FREQUENCY DETECTOR WITH WIDE-PULSE OUTPUTS

(75) Inventor: Francisco Fernandez, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 107 days.

(21) Appl. No.: 11/326,877

(22) Filed: Jan. 6, 2006

(51) Int. Cl.
*H03D 13/00* (2006.01)
*G01R 25/00* (2006.01)

(52) U.S. Cl. .......................... 327/12; 327/157
(58) Field of Classification Search .............. 327/3, 327/12, 157
See application file for complete search history.

(56) References Cited

U.S. PATENT DOCUMENTS 5,754,080 A * 5/1998 Chen et al. .................. 331/25
6,075,388 A * 6/2000 Dalmia ........................ 327/12
6,259,754 B1 * 7/2001 Jeong ......................... 375/375

* cited by examiner

*Primary Examiner*—Robert J. Pascal
*Assistant Examiner*—James E Goodley
(74) *Attorney, Agent, or Firm*—Brooks Kushman P.C.

(57) ABSTRACT

A circuit and method are provided for detecting a phase difference between at least two periodic signals. The circuit and method disclosed herein provide pulsed output signals with wide output pulse widths well suited for use to drive a charge-pump in a phase-locked loop. The wide pulse widths of the output signals generated by the circuit and method allow the charge-pump to sink or source current with higher accuracy and therefore improve the operational characteristics of the phase-locked loop. Further, the circuit and method disclosed herein allow a phase-frequency detector and an associated charge-pump to operate at a higher operational frequency due to the wide pulse widths.

16 Claims, 10 Drawing Sheets

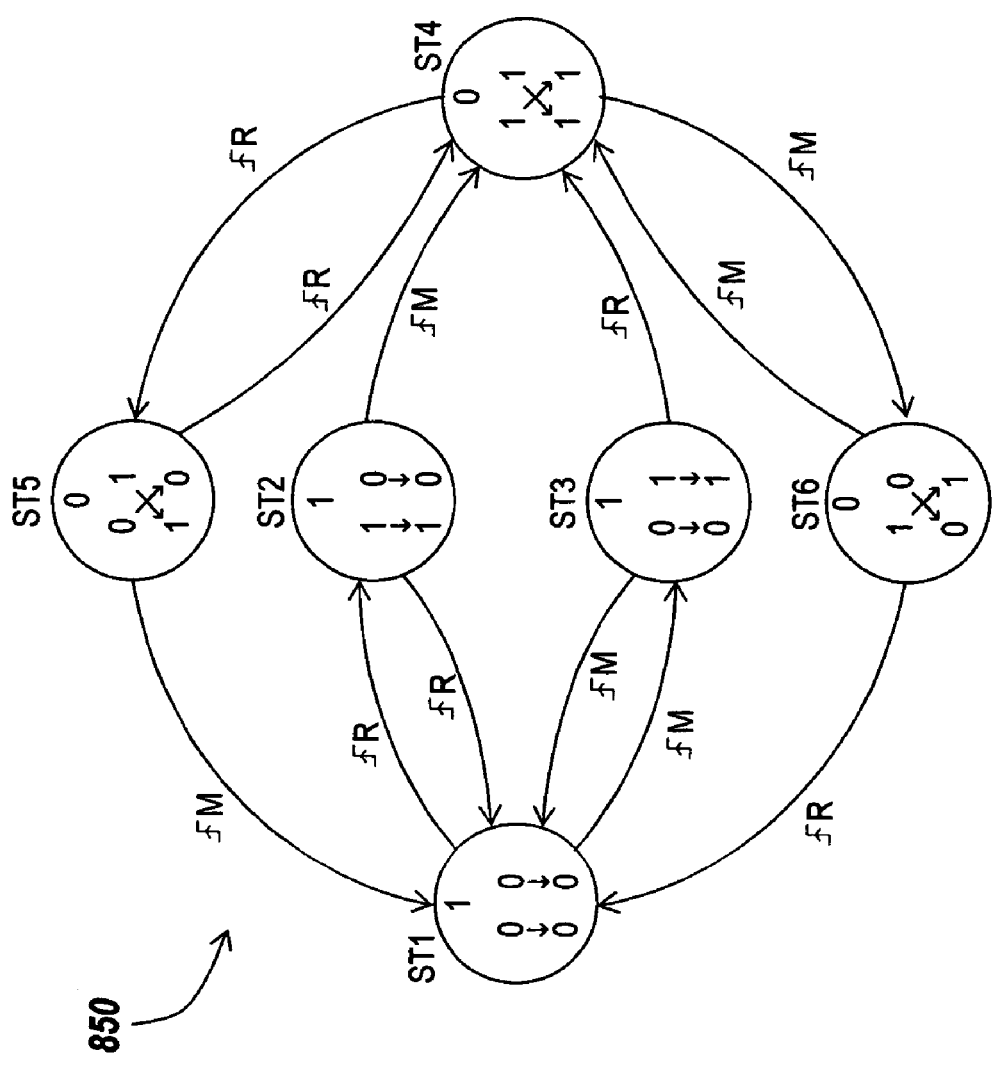
Fig. 8
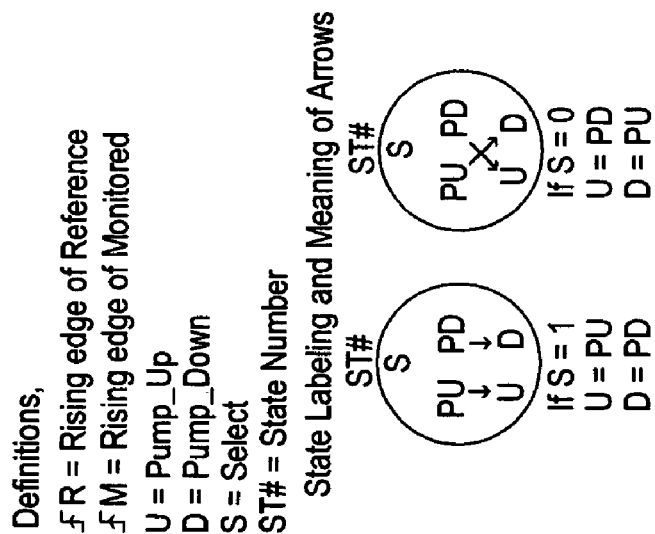
Definitions,
ƒR = Rising edge of Reference
ƒM = Rising edge of Monitored
U = Pump_Up
D = Pump_Down
S = Select
ST# = State Number

US 7,443,206 B1

HIGH-FREQUENCY LINEAR PHASE-FREQUENCY DETECTOR WITH WIDE-PULSE OUTPUTS

TECHNICAL FIELD OF INVENTION

The present invention generally relates to digital circuits, and more particularly to digital Phase-Frequency Detector circuits.

BACKGROUND OF INVENTION

A conventional linear Phase-Frequency Detector (PFD) as part of a Phase-Locked Loop (PLL) and when the loop is in lock produces output pulses with narrow pulse widths, for example, pulse widths five to ten times smaller than the period of the reference signal or clock received by the conventional PFD. Further, the output pulses have a frequency equal to the frequency of the reference signal received by the conventional PFD. These narrow pulses can be difficult to generate when the PFD is dealing with high-frequency reference signals and impose a limit in the maximum frequency of the reference clock. Additionally, when the conventional PFD drives a charge-pump within a PLL and the phase difference of the inputs of the PFD is near zero, the output pulses produced by the conventional PFD, which have narrow widths and a frequency equal to the reference signal, are problematic for the associated charge-pump. That is, the narrow output signal pulse widths are difficult for the charge-pump to respond to with sufficient accuracy to produce an accurate output current representative of the phase difference detected by the conventional PFD. Further, frequency limitations of the PFD and the charge-pump impose a limit on the maximum frequency of the reference clock that can be used to run the PLL.

Operating a PLL with a reference signal of higher frequency is desirable since it lowers the division ratio of the frequency divider. That translates into a reduction of area, power, signal switching (noise) and an increase in the frequency update of the loop. That is, corrections within the loop occur more often. Consequently, the PLL produces a cleaner output signal.

As such, there exists a need for a PFD capable of operating at higher frequency rates and capable of enabling a conventional frequency-limited charge-pump to operate at such higher frequency rates. Such a PFD produces output pulses that improve the accuracy of the charge-pump and decreases its operational frequency.

SUMMARY OF INVENTION

The present invention addresses the above-described limitations of Phase-Frequency Detectors (PFD's) that produce output pulses with pulse widths that normally are five to ten times smaller than the period of the reference signal or reference clock received on one input of the PFD. The present invention provides a PFD that, once the PLL is locked, produces output pulses with pulse widths equal to the period of the reference signal. Additionally, a PFD in accordance with the teachings of the present invention can produce output pulses with a frequency substantially equal to half the frequency of the reference signal. Thus, when a PFD in accordance with the teachings of the present invention drives a charge-pump, for example, as part of a PLL, the operational frequency of the charge-pump is substantially equal to half the frequency of the reference signal.

In one embodiment of the present invention, a phase-frequency detector is disclosed. The phase-frequency detector includes a first stage and a second stage. The first stage is configured to respond to an edge transition of a first periodic signal having a first period received on a first input node and to respond to an edge transition of a second periodic signal having a second period received on a second input node. The first stage includes a first output node and a second output node. The first stage, triggered by the first periodic signal received on the first input node, drives the first output node with a first output pulse and, triggered by the second periodic signal received on the second input node, drives the second output node with a second output pulse. The second stage is responsive to the location of the edge transition points of the outputs of the first stage to selectively drive a first output node with a first output pulse and to drive a second output node with a second output pulse. The first output pulse and the second output pulse each have a pulse width related to the location of the edge of the first periodic signal relative to the edge of the second periodic signal.

The second stage includes a selector circuit to select between the first output node and the second output node of the first stage. The second stage further includes a first multiplexer and a second multiplexer responsive to the selector circuit to select between the first output node and the second output node of the first stage. In one embodiment of the present invention, the selector circuit is a state machine.

The first stage includes a first sequential logic device coupled to the first input node and a second sequential logic device coupled to the second input node. In some embodiments of the present invention, at least one of the first or second sequential logic devices is an edge sensitive device. The first stage further includes a first inverter coupled between an output node of the first sequential logic device and a data input node of the first sequential logic device and includes a second inverter coupled between an output node of the second sequential logic device and a data input node of the second sequential logic device. The first stage is configured so that an output pulse of the first sequential logic device has a pulse width substantially equal to the first period of the first periodic signal and an output of the second sequential logic device has a pulse width substantially equal to the second period of the second periodic signal.

The phase-frequency detector is configured so after a transition of the first periodic signal the first output pulse of the second stage transitions and after a transition of the second periodic signal the second output pulse of the second stage transitions.

In another embodiment of the present invention, a phase-locked loop circuit (PLL) is disclosed. The PLL includes a voltage controlled oscillator (VCO) responsive to an analog control signal to produce a periodic output signal, and a phase-frequency detector producing a first output signal on a first output node having a first pulse width and producing a second output signal on a second output node having a second pulse width. Half of the difference in pulse width between the first pulse width and the second pulse width represents a detected phase difference between a reference signal received on a first input node of the phase-frequency detector and a monitored signal received on a second input node of the phase-frequency detector. The monitored signal is representative of an output of the VCO. The monitored signal has a frequency proportional to the frequency of the VCO.

The PLL can further include a charge-pump responsive to the first output signal and the second output signal to produce a current having an effective value proportional to the detected phase difference between the reference signal and the monitored signal. The PLL can further include a charge-pump responsive to the first output signal and the second output signal to produce a current having an effective value proportional to the pulse width difference between the first output pulse and the second output pulse. The PLL can further include a loop filter configured to produce the analog control signal derived from the charge-pump current.

The PLL is configurable so that the output pulse with the larger pulse width controls a polarity of the current.

In one embodiment of the present invention, a method for driving a charge-pump in a phase-locked loop (PLL) to generate a current is disclosed. The method includes the steps of detecting a phase difference between two signals, generating in response to the detected phase difference a first pulse having a first pulse width and a second pulse having a second pulse width, and driving a charge-pump with the first and second pulse to generate an average output current, on a per-period basis, proportional to one-half of the pulse width difference between the first output pulse and the second output pulse. The two signals can include a reference signal and a monitored signal. The monitored signal can represent an output signal of a voltage controlled oscillator.

The pulse width difference between the first output pulse and the second output pulse represents twice the phase difference between the two signals. Further, the method allows for the control of the polarity of the net output current. In one embodiment, the output pulse having the larger width determines the polarity of the net output current.

BRIEF DESCRIPTION OF DRAWINGS

An illustrative embodiment of the present invention will be described below relative to the following drawings.

FIG. 8 depicts an exemplarily state diagram of the phase-frequency detector illustrated in FIG. 3A.

DETAILED DESCRIPTION

The illustrative embodiment of the present invention provides a phase-frequency detector (PFD) that produces output pulses with pulse widths that can equal or exceed a period of a reference signal or clock received on an input of the PFD. For example, when a PFD in accordance with the teachings of the present invention is within a PLL and once the loop is in lock, the PFD produces output pulses whose width is equal to the period of the reference signal or clock received on an input of the PFD. In this manner, when a PFD in accordance with the teachings of the present invention drives a charge-pump, for example, in a PLL, the wide pulse widths produced by the PFD improve the operational characteristics of the charge-pump by allowing the charge-pump more time to switch current polarity. Additionally, a PFD in accordance with the teaching of the present invention and when used within a PLL and once the loop is in lock produces the wide output pulses with a frequency substantially equal to half the frequency of the reference signal, which further assists the charge-pump with current switching. As such, the operational frequency of a PFD in accordance with the teachings of the present invention can be between five to ten times higher than the operating frequency of a conventional PFD without having to change the topology of the charge-pump.

The range of maximum operational frequency of a conventional PFD and a conventional charge-pump in integrated circuits depends on the process technology used. For sub-micron CMOS process ranging from 130 nm to 65 nm minimum gate length the frequency range could be from 250 MHz to 1 GHz and in some cases limited by the charge-pump. The PFD described in this invention when combined with a conventional charge-pump is capable of operating five to ten times higher without having to change the topology of the charge-pump. Furthermore, a PLL that includes a PFD in accordance with the teachings of the present invention can generate output signals with improved phase noise and clock jitter characteristics. Consequently, clock generation and clock distribution using the PLL is improved.

Figure 1:
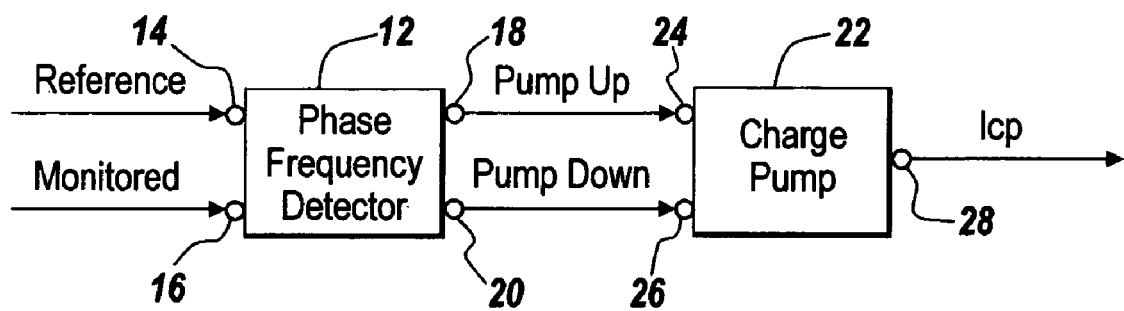
FIG. 1 depicts an exemplary prior art block diagram representation of a phase-frequency detector driving a charge-pump.

FIG. 1 is an exemplarily prior art block diagram of a prior art phase-frequency detector 12 and a charge-pump 22 suitable for use in a Phase-Lock Loop circuit (not shown). The phase-frequency detector 12 includes a first input node 14 to receive a reference signal and includes a second input node 16 to receive a monitored signal, such as a feedback signal from a voltage controlled oscillator (VCO). The phase-frequency detector 12 further includes a first output node 18 and a second output node 20. The phase-frequency detector 12 produces the Pump-Up signal and the Pump-Down signal based on the phase difference detected between the reference signal and the monitored signal. The phase-frequency detector 12 asserts the Pump-Up signal on the first output node 18 and asserts the Pump-Down signal on the second output node 20. For the purposes of the present invention the particular details on how the prior art phase-frequency detector 12 operates and the configuration of a suitable prior art phase-frequency detector is well know in the art and is therefore not discussed herein.

The charge-pump 22 includes a first input node 24, a second input node 26, and an output node 28. The charge-pump receives on the first input node the Pump-Up signal and receives on the second input node 26 the Pump-Down signal and, in turn, generates a net or effective output current $I_{cp}$ proportional to the phase difference detected by the phase-frequency detector 12. The current $I_{cp}$ is asserted on the output node 28.

Figure 2A:
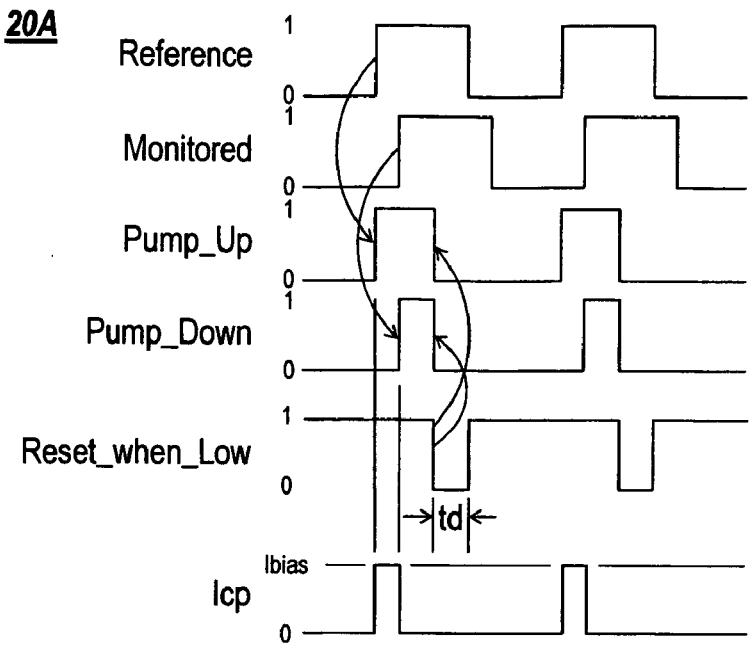
FIGS. 2A and 2B are exemplary prior art timing diagrams depicting operation of the prior art phase-frequency detector and charge-pump depicted in FIG. 1.
Figure 2B:
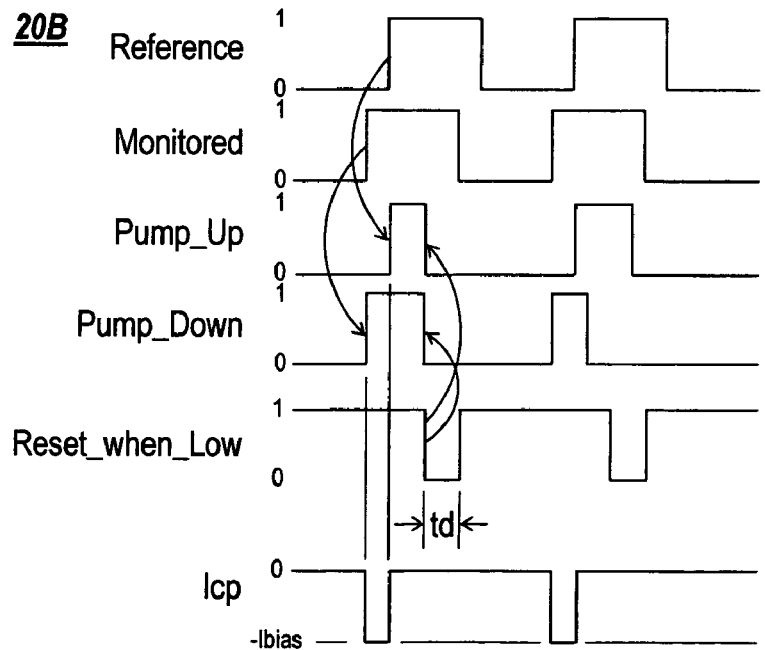

FIGS. 2A and 2B are exemplary prior art timing diagrams illustrating operation of the phase-frequency detector 12 and the charge-pump 22 responding to a phase difference between the reference and the monitored signals. A phase difference is caused by a time shift between signals of the same frequency or by a frequency difference between the signals or by both mechanisms. Timing diagram 20A illustrates the case in which the reference signal leads the monitored signal and, as a result, the charge-pump 22 produces a pulsed current $I_{cp}$ having a positive bias with a pulse width equal to the phase difference between the reference signal and the monitored signal.

Timing diagram 20B illustrates the case in which the reference signal lags the monitored signal. As such, the charge-pump 22 produces a pulsed current $I_{cp}$ having a negative bias with a pulse width equal to the phase difference between the reference signal and the monitored signal. The polarity of the current $I_{cp}$ produced by the charge-pump 22 depends on whether the reference signal or the monitored signal is ahead.

As timing diagrams 20A and 20B illustrate, the Pump-Up and Pump-Down signals produced by the phase-frequency detector 12 overlap for a certain amount of time when both have a high value. This overlap time is not related to the phase difference between the input signals. It is desirable that that the overlap time be as short as possible and is usually five to ten times smaller than the period of the reference signal. Once the PLL is locked, the phase difference between the reference and the monitored signal becomes zero, the Pump-Up and Pump-Down pulses are overlapped and equal to one another and their pulse width is then one fifth to one tenth of the period of the reference signal. Moreover, the frequency of the Pump-Up and Pump-Down signals produced by the phase-frequency detector 12 are the same as the reference signal. In and around lock, the narrow pulse widths of the Pump-Up and Pump-Down signal produced by the phase-frequency detector 12 are problematic or burdensome to the charge-pump 28. The smaller pulse widths require the charge-pump 22 to quickly and accurately switch polarities of the current and as such, the charge-pump has difficulty in maintaining accuracy of the current produced in proportion to the phase difference detected by the phase-frequency detector 12.

Figure 3A:
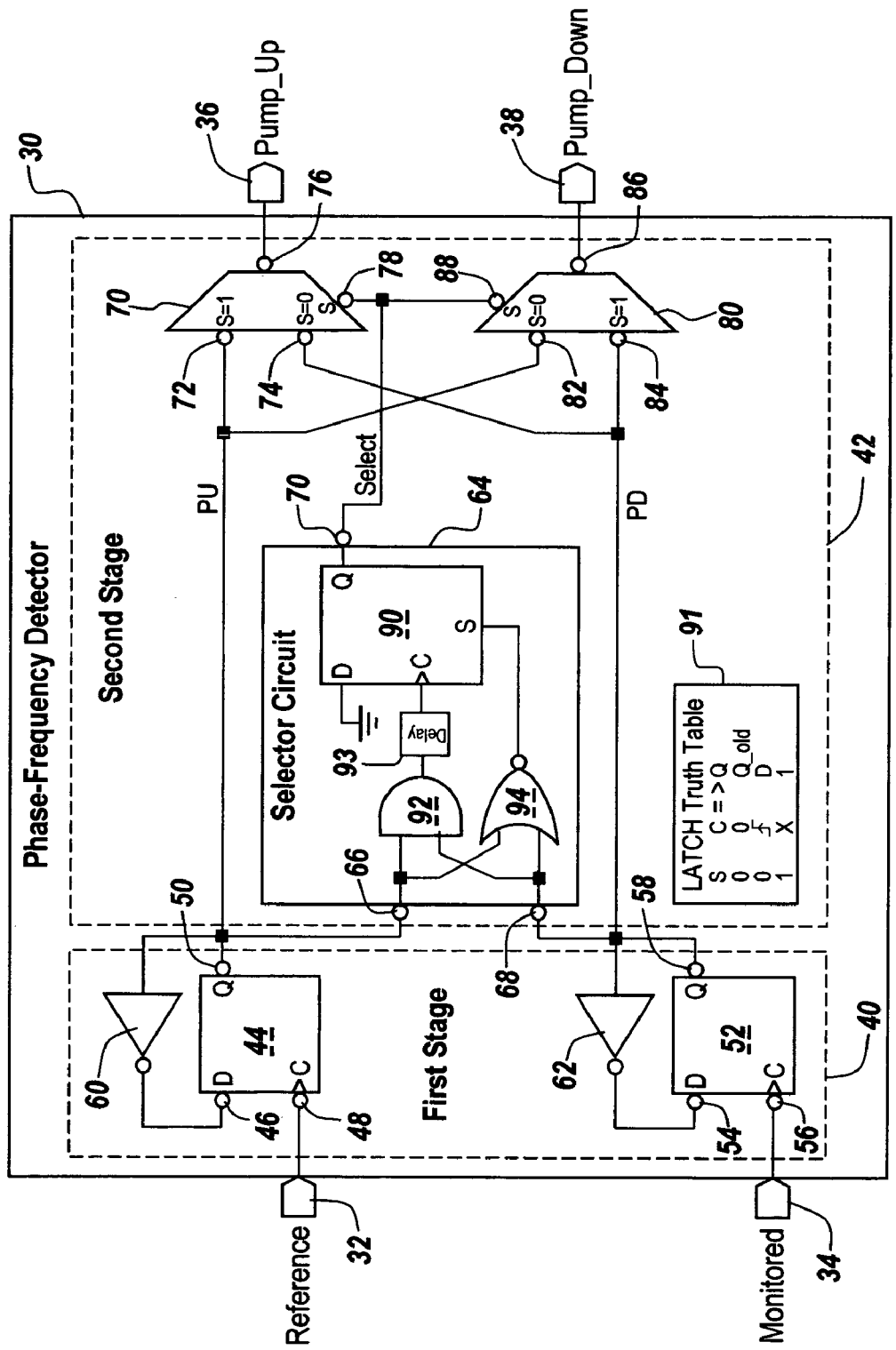
FIG. 3A depicts an exemplary block diagram of a phase-frequency detector in accordance with the teachings of the present invention.

FIG. 3A depicts an exemplary phase-frequency detector in accordance with the teachings of the present invention. The phase-frequency detector 30 includes a first stage 40 and a second stage 42. The phase-frequency detector 30 further includes a first input node 32, a second input node 34, a first output node 36, and a second output node 38. The phase frequency 30 receives a reference signal on the first input node 32, and a monitored signal, for example, a feedback signal in a PLL, on the second input node 34. The phase frequency detect 30 produces a Pump-Up signal that is asserted on the first output node 36 and produces a Pump-Down signal that is asserted on the second output node 38. The first stage 40 includes a first sequential logic element 44, a second sequential logic element 52, a first inverter 60, and a second inverter 62. The second stage 42 includes a selector circuit 64, a first multiplexer (MUX) 70 and a second MUX 80.

The first sequential logical element 44 is an edge-triggered device and includes a first input node 46, a second input node 48, and an output node 50. The second sequential logic device 52 is an edge triggered device and includes a first input node 54, a second input node 56, and an output node 58.

The first input node 46 of the first sequential logic device 44 is coupled to the output of the first inverter 60. The second input node 48 of the first sequential logic device 44 is coupled to the first input node 32 to receive the reference signal. The output node 50 of the first sequential logic device 44 is coupled to the input of the first inverter 60, a first input node 72 of the MUX 70, a first input node 82 of the MUX 80, and a first input node 66 of the selector circuit 64. The first sequential logical element 44 produces a PU signal on the output node 50. The first sequential logic device 44 and the second sequential logic device 52 are configured as toggle flip-flops.

The first input node 54 of the second sequential logic device 52 is coupled to the output node of the second inverter 62. The second input node 56 of the second sequential logic device 52 is coupled to the second input node 34 of the phase-frequency detector 30 to receive the monitored signal. The output node 58 of the second sequential device 52 is coupled to the input of the second inverter 62, a second input node 68 of the selector circuit 64, a second input node 74 of the MUX 70, and a second input node 84 of the MUX 80. The second sequential logical element 52 produces a PD signal on the output node 58.

The selector circuit 64 includes the first input node 66 to receive the output signal or PU signal produced by the first sequential logic device 44, the second input node 68 to receive the output signal or the PD signal produced by the second sequential logic device 52, and an output node 70. The selector circuit 64 produces a select signal from the PU and PD signals and asserts the select signal on the output node 70.

The first MUX 70 includes the first input node 72 to receive the PU signal, the second input node 74 to receive the PD signal, a third input node 78 to receive the select signal, and an output node 76 coupled to the first output node 36 of the phase-frequency detector 30. The second MUX 80 includes the first input node 82 to receive the PU signal, the second input node 84 to receive the PD signal, a third input node 88 to receive the select signal, and an output node 86 coupled to the second output node 38 of the phase-frequency detector 30.

The selector circuit 64 includes a sequential logic device 90, an AND gate 92 a NOR gate 94, and a delay element 93. The sequential logic device 90 can be a latch or a D-type flip-flop. Truth table 91 defines an operation and function of the sequential logic device 90. The first input of the AND gate 92 is coupled to the first input node 66 and to the first input node of the NOR gate 94. The second input node of the AND gate 92 is coupled to the second input node 68 and to the second input node of the NOR gate 94. The output of the AND gate 92 is coupled to an input of the delay element 93. The sequential logic element 90 includes a data input node D, a clock input node C, a set input node S, and an output node Q. The data input node D of the sequential logic device 90 is coupled to a logic "0" value (ground in the figure) and the clock input node C is coupled to an output of the delay element 93. The set input node S of the sequential logic element 90 is coupled to the output of the NOR gate 94 and the Q output of the sequential logic element 90 is coupled to the output node 70 to assert the select signal. The delay element 93 delays the propagation of the output of the AND gate 92 to avoid a race condition.

In operation, the select signal reaches a logic "0" value triggered by both input nodes 66 and 68 reaching a logic "1" value. Further, the select signal has a logic "1" value during the time when both PU and PD have a logic "0" value. Moreover, although the logic "1" to logic "0" transition of the select signal is edge triggered the logic "1" value of the select signal is level sensitive, based on combinational logic. Furthermore, in operation, the select signal has a logic "1" value whenever the set input node S has a logic "1" value. The select signal reaches a logic "0" value or the value of data input node D, whenever the clock input node C transitions from a logic "0"

value to a logic "1" value while the set input node S has a logic "0" value. Further, the select signal has a value equal to the previous value of the Q output whenever the set input node S has a logic "0" value and the clock input node C has a logic "0" value.

Those skilled in the art will appreciate the logic elements forming the select circuit 64 are merely illustrative and other logic gate types and sequential logic device types are well suited for use in forming the selector circuit 64. For example, if the select circuit is configured with a D-type flip-flop as the sequential logic device, the D-type flip-flop is configurable to be either rising edge sensitive or falling edge sensitive. Detailed operation and function of the phase-frequency detector 30 is discussed in more detail below in relation to FIGS. 5A through 6B.

Figure 3B:
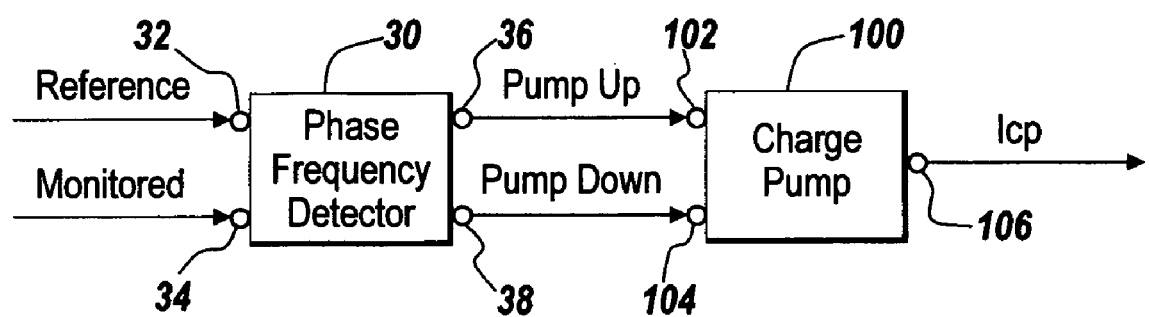
FIG. 3B depicts an exemplary block diagram of the phase-frequency detector depicted in FIG. 3A driving a charge-pump in accordance with the teachings of the present invention.

FIG. 3B depicts the phase-frequency detector 30 coupled with a charge-pump 100. The charge-pump 100 includes a first input node 102 to receive the Pump-Up signal, a second input node 104 to receive the Pump-Down signal, and an output node 106. The charge-pump 100 generates a net or effective output current $I_{cp}$ proportional to the phase difference detected by the phase-frequency detector 30. The charge-pump 100 asserts the current $I_{cp}$ on the output node 106.

Figure 3C:
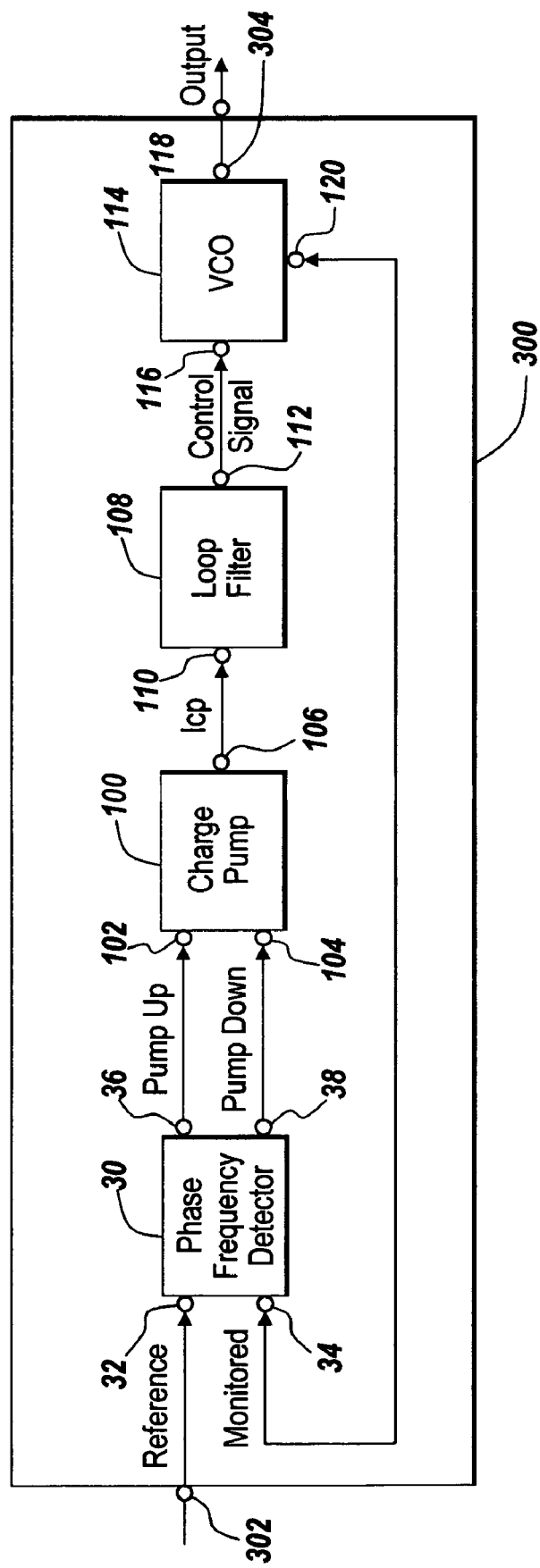
FIG. 3C depicts an exemplary block diagram of the phase-frequency detector depicted in FIG. 3A forming a portion of a phase-locked loop in accordance with the teachings of the present invention.

FIG. 3C illustrates an exemplary Phase-Lock Loop circuit 300 suitable for use with a phase-frequency detector in accordance with the teachings of the present invention. The PLL 300 includes the phase-frequency detector 30, the charge-pump 100, a loop filter 108, and a VCO 114. The PLL 300 includes a first input node 302 to receive the reference signal and an output node 304 to assert a periodic signal generated by the VCO 114. The loop filter 108 includes an input node 110 and an output node 112. Those skilled in the art will appreciate the loop filter 108 is configurable to have a signal node that acts as an input and output node. The VCO 114 includes an input node 116, a first output node 118, and a second output node 120. Those skilled in the art will appreciate the structure of the PLL 300 illustrated in FIG. 3C is merely meant to facilitate one aspect of the present invention and other configurations and structures of the PLL 306 are well suited for use with the present invention. For example, the first output node 118 can be connected directly an input node of the PFD 30 or a divider could exist between first output node 118 and an input node of the PFD 30.

The loop filter 108 receives the current $I_{cp}$ produced by the charge-pump 100 on the input node 110 and, in turn, produces an analog voltage control signal from the current $I_{cp}$. The analog voltage control signal produced by the loop filter 108 is asserted on the output node 112. The VCO 114 receives the analog voltage control signal on the input node 116 and, in turn, produces an output signal having an oscillation frequency related to the frequency of the reference signal. The monitored signal, in this instance, is received directly from the VCO 114 via the second output node 120 as part of a feedback loop to control the frequency of oscillation of the output signal generated by the VCO 114. Those skilled in the art will appreciate that the PLL 300 can include other features and components, such as switches and frequency dividers and those skilled in the art will appreciate that the PLL 300 is meant to illustrate merely one application of the phase-frequency detector 30 in accordance with the teachings of the present invention.

Figure 4:
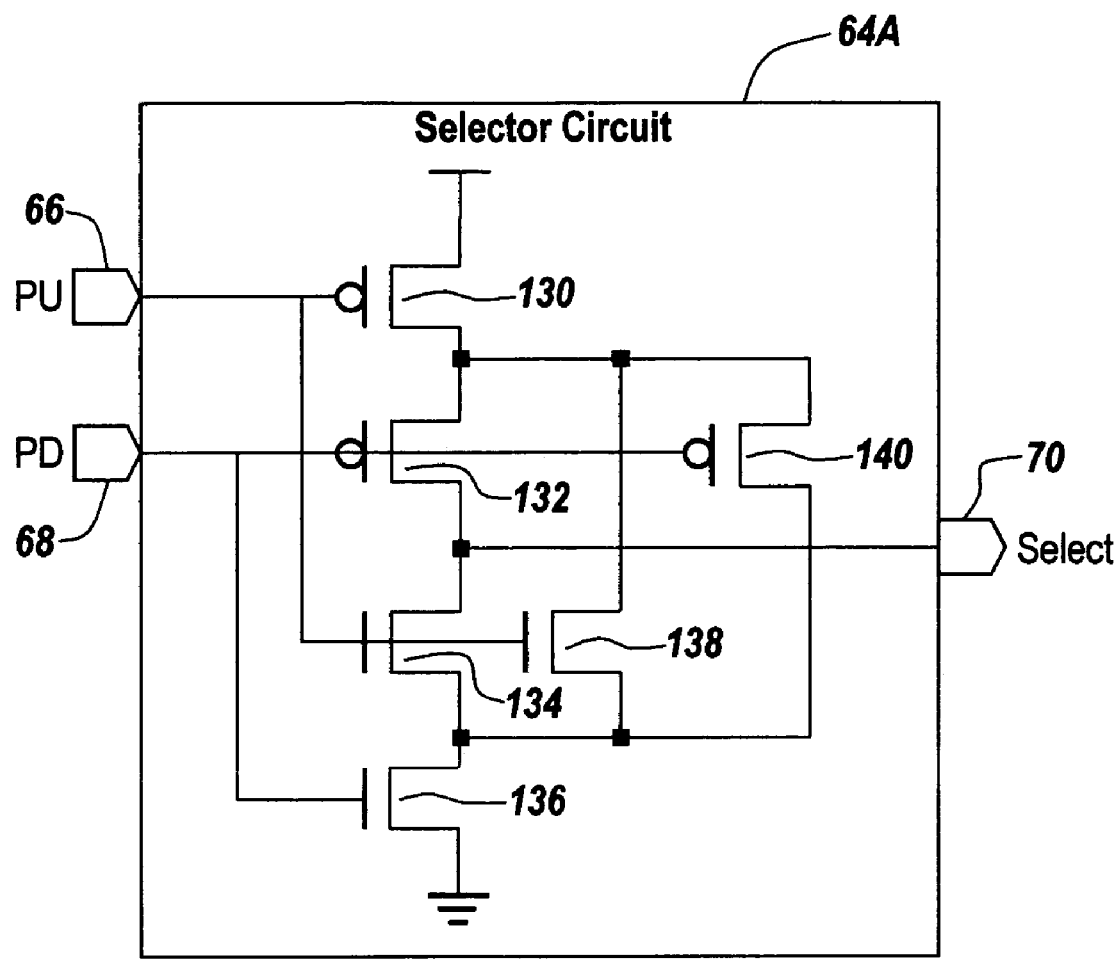
FIG. 4 depicts another embodiment of the select circuit depicted in FIG. 3A.

FIG. 4 illustrates another embodiment of the selector circuit 64. The selector circuit 64A includes the first input node 66, the second input node 68, and the output node 70. The selector circuit 64A further includes a pull-down stack of serially connected transistors formed by PMOS transistor 130, PMOS transistor 132, NMOS transistor 134, and NMOS transistor 136. The selector circuit 64A further includes PMOS transistor 140 and NMOS transistor 138.

The gate of PMOS transistor 130 is coupled to the first input node 66 to receive the PU signal and is coupled to the gate of NMOS transistor 134. The source of PMOS transistor 130 is coupled to a voltage source such as VDD. The drain of PMOS transistor 130 is coupled to the source of the PMOS transistor 132, the drain of the NMOS transistor 138, and the source of the PMOS transistor 140. The gate of the PMOS transistor 132 is coupled to the second input node 68, and to the gate of the NMOS transistor 136. The drain of the PMOS transistor 132 is coupled to the output node 70 and to the drain of the NMOS transistor 134. The NMOS transistor 134 has its source coupled to the drain of the NMOS transistor 136, the source of the NMOS transistor 138, and the drain of the PMOS transistor 140. The NMOS transistor 136 has its source coupled to ground. The NMOS transistor 138 has its gate coupled to the first input node 66 and the PMOS transistor 140 has its gate coupled to the second input node 68.

In operation, the selector circuit 64A produces a select signal that is digitally equivalent to the one produced by the selector circuit 64, but is generated as follows. The selector circuit 64A is a pre-charged circuit that utilizes the parasitic capacitance of internal nodes to store the value of signals. The select signal transitions from a logic "1" value to a logic "0" value when both PU and PD reach a logic "1" value. The select signal transitions from a logic "0" value to a logic "1" value when both PU and PD reach a logic "0" value.

Figure 5A:
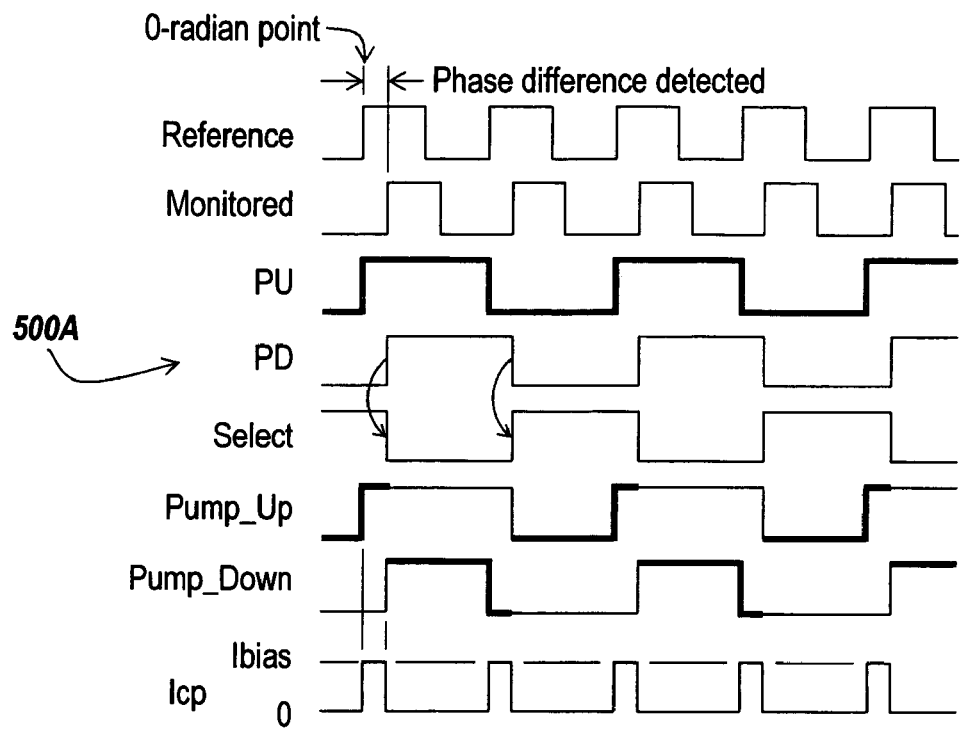
FIGS. 5A and 5B are exemplary timing diagrams depicting operation of the phase-frequency detector depicted in FIG. 3A when the initial value of signals PU, PD, reference signal, and monitored signal are all logic "0" values.
Figure 5B:
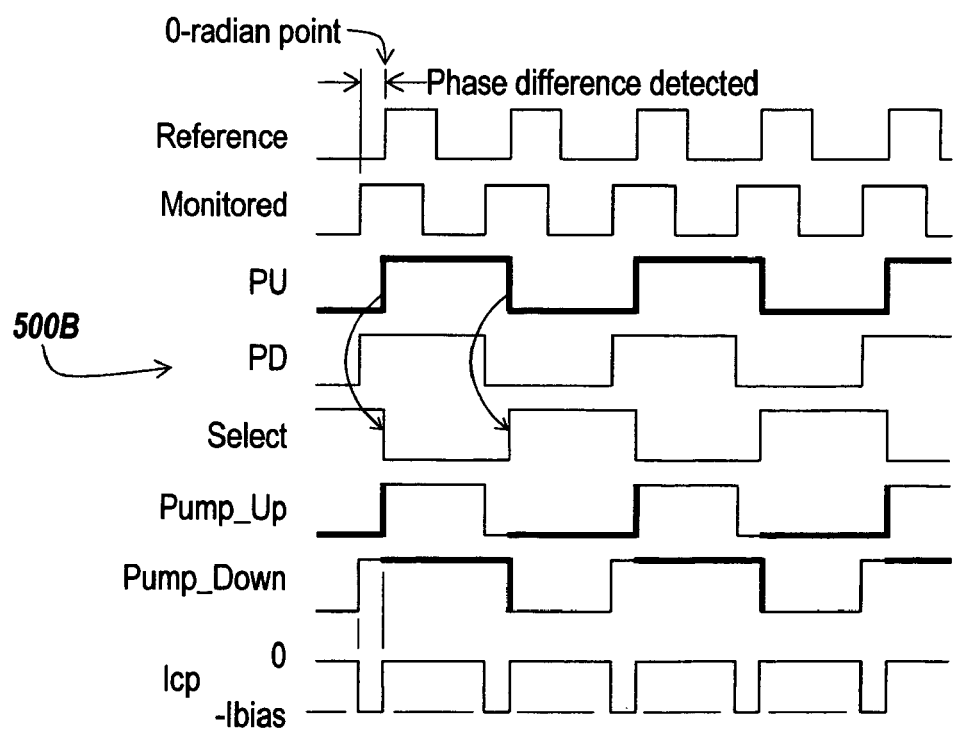

FIGS. 5A and 5B illustrate exemplarily timing diagrams that depict operation of the phase-frequency detector 30 in accordance with the teachings of the present invention. The waveforms illustrated in FIGS. 5A and 5B depict operation of the phase-frequency detector 30 when the initial value of both PU signal and PD signal is a logic "0" value.

Timing diagram 500A illustrates operation of the phase-frequency detector 30 in accordance with the teachings of the present invention when the reference signal leads the monitored signal and the initial value of the PU signal and the PD signal is a logic "0" value, while the reference signal and the monitored signal are at a logic "0" value. As depicted, the value of the PU signal is low at a logic "0" level until the first stage 40 detects the rising edge of the reference signal, at which time the PU signal rises from the logic "0" level to a logic "1" level. The value of the PU signal remains at the logic "1" level for one full period of the reference signal and falls to the logic "0" level on the next rising edge of the reference signal. This sequence repeats until interrupted. Thus, the pulse width of the PU signal is equal to one period of the reference signal.

In similar fashion, when the first stage 40 detects the rising edge of the monitored signal the PD signal rises from a logic "0" level to a logic "1" level and remain at the logic "1" level for one period of the monitored signal. When the first stage 40 detects a subsequent rising edge of the monitored signal, the PD signal transitions or falls from the logic "1" level to the logic "0" level. This sequence repeats until interrupted. Thus, the pulse width of the PD signal is equal to one period of the monitored signal.

The select signal produced by the select circuits 64 or 64A in the manner described above, changes its value, during these operating conditions, coinciding with the transitions of the PD signal. The select signal can rise and fall separate from the rising and falling edge of the PD signal as is discussed below under other operating conditions. That is, in timing diagram 500A the select signal initially begins at a logic "1" level and falls to a logic "0" level on the rising edge of the PD signal and again rises to a logic "1" level on the falling edge of the PD signal. The select signal controls operation of the first MUX 70 and the second MUX 80 to selectively drive the first output node 36 with the Pump-Up signal and to selectively drive the second output node 38 with the Pump-Down signal. As illustrated in timing diagram 500A, when the select signal has a logic "1" value the Pump-Up signal follows or is digitally equivalent to the PU signal and the Pump-Down signal follows or is digitally equivalent to the PD signal. When the select signal falls from a logic "1" level to a logic "0" level, the Pump-Up signal follows or is digitally equivalent to the PD signal and the Pump-Down signal follows or is digitally equivalent to the PU signal. Timing diagram 500A illustrate how the Pump-Up and Pump-Down signals follow the PU and PD signals according to the value or level of select signal.

The following of the Pump-Up signal and the Pump-Down signal with respect to the PU signal and the PD signal as just described is illustrated in the diagram 500A with the line thickness differential shown with the Pump-Up signal and the Pump-Down signal. More specifically, with regard to timing diagram 500A, initially the Pump-Up signal follows the PU signal until the rising edge of the PD signal at which time the select signal falls toggling the first MUX 70 and the second MUX 80 to select different inputs and as such the Pump-Up signal begins to follow the PD signal. Likewise, initially the Pump-Down signal follows the PD signal until the rising edge of the PD signal at which time the select signal falls toggling the first MUX 70 and the second MUX 80 to select different inputs and as such, the Pump-Down signal begins to follow the PU signal.

In operation, so long as the phase-frequency detector 30 detects that the reference signal leads the monitored signal, the Pump-Up (i.e., the wider-pulse signal in this instance) determines the polarity or bias of the current $I_{cp}$ produced by an associated charge-pump, for example, the charge-pump 100. Further, when the PLL is near lock, the wide pulse widths of the Pump-Up and the Pump-Down signals allow an associated charge-pump to improve its performance accuracy to produce a net or effective output current $I_{cp}$ proportional to the pulse width difference between the pulse width of the Pump-Up signal and the pulse width of the Pump-Down signal.

Timing diagram 500B depicts the case or conditions where the monitored signal leads the reference signal and the initial value of both PU and PD signal is a logic "0" value, while the reference signal and the monitored signal each have a logic "0" value. As depicted in timing diagram 500B, under these operating conditions, changes in the select signal coincide with the transition of the PU signal. That is, the select signal falls and rises on the rising and falling edge of PU signal, respectively. In this manner, the Pump-Up signal rises from a logic "0" value to a logic "1" value on the rising edge of the PU signal and falls from a logic "1" level to a logic "0" level on the falling edge of PD signal. In similar fashion, the Pump-Down signal rises from a logic "0" level to a logic "1" level on the rising edge of the PD signal and falls from the logic "1" level to the logic "0" level on the falling edge of the PU signal.

In timing diagram 500B the select signal has an initial logic "1" value and falls to a logic "0" value on the rising edge of the PU signal and again rises to a logic "1" level on the falling edge of the PU signal. The select signal controls operation of the first MUX 70 and the second MUX 80 to selectively drive the first output node 36 with the Pump-Up signal and to selectively drive the second output node 38 with the Pump-Down signal. As illustrated in timing diagram 500B, when the select signal has a logic "1" value the Pump-Up signal follows or is digitally equivalent to the PU signal and the Pump-Down signal follows or is digitally equivalent to the PD signal. When the select signal falls from a logic "1" level to a logic "0" level, the Pump-Up signal follows or is digitally equivalent to the PD signal and the Pump-Down signal follows or is digitally equivalent to the PU signal. Timing diagram 500B illustrate how the Pump-Up and Pump-Down signals follow the PU and PD signals according to the value or level of select signal.

The following of the Pump-Up signal and the Pump-Down signal with respect to the PU signal and the PD signal as just described is illustrated in the diagram 500B with the line thickness differential shown with the Pump-Up signal and the Pump-Down signal. More specifically, with regard to timing diagram 500B, initially the Pump-Up signal follows the PU signal until just after the rising edge of the PU signal at which time the select signal falls toggling the first MUX 70 and the second MUX 80 to select different inputs and as such the Pump-Up signal begins to follow the PD signal. Likewise, initially the Pump-Down signal follows the PD signal until just after the rising edge of the PU signal at which time the select signal falls toggling the first MUX 70 and the second MUX 80 to select different inputs and as such the Pump-Down signal begins to follow the PU signal.

So long as the phase-frequency detector 30 detects that the monitored signal leads the reference signal, the PD signal (i.e., the wider-pulse signal in this instance) determines the polarity or bias of the current $I_{cp}$ produced by an associated charge-pump, for example, the charge-pump 100. Further, when the PLL is near lock, the wide pulse widths of the Pump-Up and Pump-Down signals allow an associated charge-pump to improve operational accuracy to produce a net or effective output current $I_{cp}$ proportional to the pulse width difference between the pulse width of the Pump-Up signal and the pulse width of the Pump-Down signal.

Accordingly, the net or effective output current of the charge-pump coupled to the phase-frequency detector 30 is proportional to the difference between the pulse widths of the Pump-Up and Pump-Down signals. In other words, the associated charge-pump produces a net or effective output current $I_{cp}$ of about zero amps when both the Pump-Up and Pump-Down signals have an equal value and produces a sinking output current $I_{cp}$ when the Pump-Down signal has a logic "1" value and the Pump-Up signal has a logic "0" value.

In this manner, the wide pulse widths of the Pump-Up and Pump-Down signal allow the associated charge-pump to accurately switch from sinking or sourcing current to produce an accurate output current representative of the phase difference detected by the phase-frequency detector 30. Further, and once the PLL is locked, the frequency of the Pump-Up and Pump-Down signal is equal to about one half of the reference signal which can allow a phase-frequency detector in accordance with the teachings of the present invention to operate at a rate up-to ten times the frequency of the reference signal without changing the topology of the charge-pump.

Figure 6A:
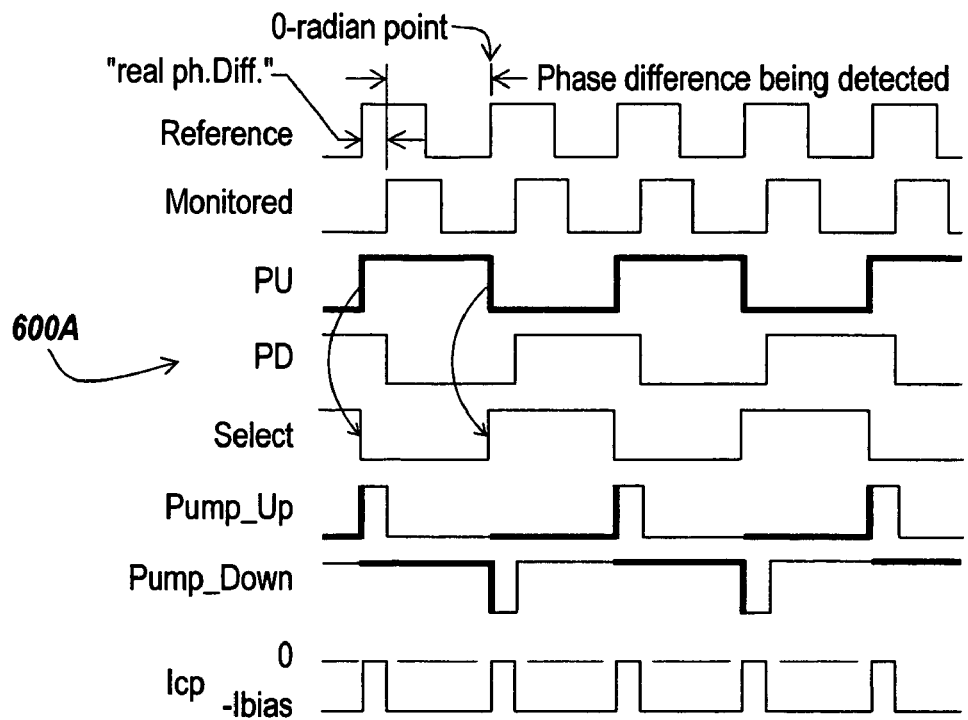
FIGS. 6A and 6B are exemplary timing diagrams illustrating operation of the phase-frequency detector depicted in FIG. 3A when the initial values of the signals PU and PD are different to each other while the reference signal and monitored signal each have a logic "0" value.
Figure 6B:
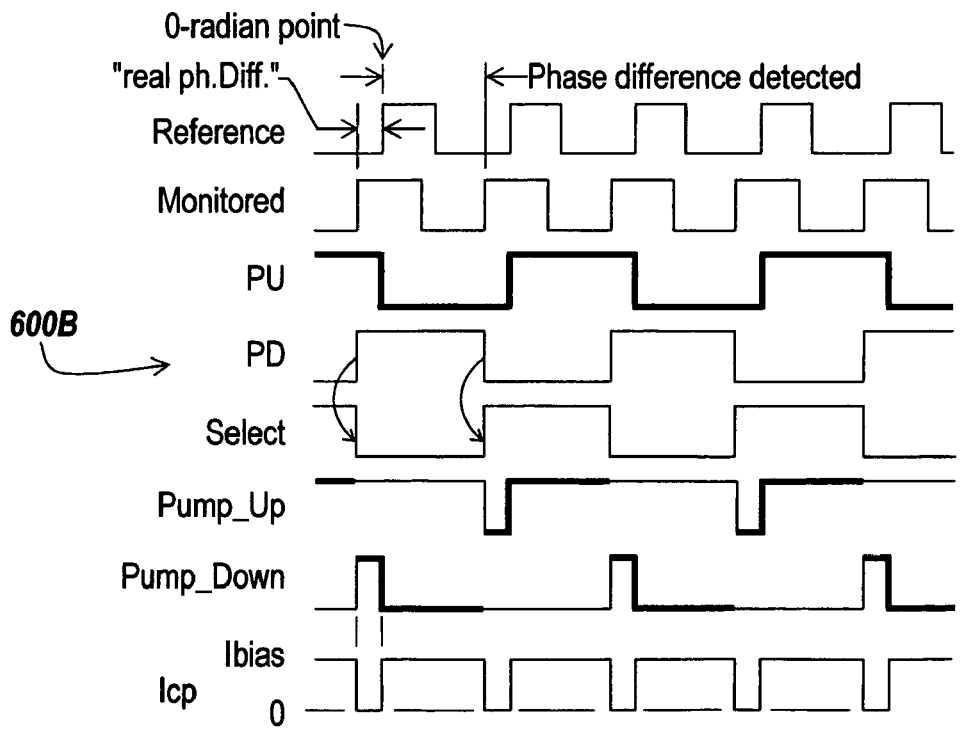

FIGS. 6A and 6B depict exemplary timing diagrams of the phase-frequency detector 30 in accordance with the teachings of the present invention. The exemplary timing diagrams also illustrate the phase-frequency detector 30 when driving a charge-pump as shown in FIGS. 3B and 3C. Timing diagrams 600A and 600B represent the case or conditions when the initial value of the signal PU and signal PD are different, while the reference signal and the monitored signal each have a logic "0" value.

The timing diagram 600A represents the case when the reference signal leads the monitored signal. With the initial value of the signal PU and signal PD being different, the phase-frequency detector 30 detects a phase frequency difference between the reference signal and the monitored signal that is different from the actual phase difference between the two signals. Under the initial conditions depicted by the timing diagram 600A, the phase-frequency detector 30 initially determines the monitored signal leads the reference signal although the opposite is true and drives an associated charge-pump to produce a current $I_{cp}$ with a negative polarity or bias to slow the frequency of the monitored signal.

Timing diagram 600A illustrates both the actual or real phase difference and the detected phase difference between the two signals. The real phase difference is between the first illustrated rising edge of the reference signal and the first illustrated rising edge of the monitored signal, however, the phase-frequency detector 30 detects a phase difference between the first illustrated rising edge of the monitored signal and the second illustrated rising edge of the reference signal.

Further, the polarity of the current $I_{cp}$ produced by the associated charge-pump 100 starts in the opposite direction to what the real phase difference requires. Nonetheless, those skilled in the art will appreciate that any rising edge of the reference signal is a valid reference to which to align the monitor signal. The phase-frequency detector 30 operate as discussed above in relation to FIGS. 3A-5B and as such, the charge-pump 100 generates a net or effective output current $I_{cp}$ proportional to the phase difference between the reference and the monitored signals detected by the phase-frequency detector 30. The actual phase difference is represented by half the difference in pulse widths between the signals Pump-Up and Pump-Down.

In operation within a PLL, the phase-frequency detector 30, attempts to align the first rising edge of the monitored signal to the second rising edge of the reference signal. Once that happens and from that new reference point of alignment, the pumping polarity of the output current $I_{cp}$ is according to the smallest phase difference between the reference signal and the monitored signal. This transitory state, in which the phase-frequency detector 30 within a PLL corrects the largest phase difference instead of the shortest one, is part of a normal PLL phenomenon known as "cycle slipping". Cycle slipping occurs when the frequency difference between the reference signal and the monitored signal is high enough that pumping, with correct polarity cannot stop the sliding of the monitored signal with respect to the reference signal within a given period. Although the polarity of the output current $I_{cp}$ switches during cycle slip the correct output current $I_{cp}$ polarity dominates and thus, the frequency difference, phase difference, or both, between the reference signal and the monitored signal is eliminated with time.

As depicted in timing diagram 600A, the value of the PU signal is low at a logic "0" level until the first stage 40 detects the rising edge of the reference signal, at which time the PU signal rises from the logic "0" level to a logic "1" level. The value of the PU signal remains at the logic "1" level for one full period of the reference signal and falls to the logic "0" level on the next rising edge of the reference signal. This sequence repeats until interrupted. Thus, the pulse width of the PU signal is equal to one period of the reference signal.

In similar fashion, when the first stage 40 detects the rising edge of the monitored signal the PD signal falls from a logic "1" level to a logic "0" level and remains at the logic "0" level for one period of the monitored signal. When the first stage 40 detects a subsequent rising edge of the monitored signal, the PD signal transitions or rises from the logic "0" level to the logic "1" level. This sequence repeats until interrupted. Thus, the pulse width of the PD signal is equal to one period of the monitored signal.

The select signal produced by the selector circuits 64 or 64A transitions with the rising and falling edge of the PU signal under these operating conditions. That is, in timing diagram 600A the select signal initially begins at a logic "1" level and falls to a logic "0" level on the rising edge of the PU signal and again rises to a logic "1" level on the falling edge of the PU signal. The select signal controls operation of the first MUX 70 and the second MUX 80 to selectively drive the first output node 36 with the Pump-Up signal and to selectively drive the second output node 38 with the Pump-Down signal. As illustrated in timing diagram 600A, when the select signal has a logic "1" value the Pump-Up signal follows or is digitally equivalent to the PU signal and the Pump-Down signal follows or is digitally equivalent to the PD signal. When the select signal falls from a logic "1" level to a logic "0" level, the Pump-Up signal follows or is digitally equivalent to the PD signal and the Pump-Down signal follows or is digitally equivalent to the PU signal. Timing diagram 600A illustrates how the Pump-Up and Pump-Down signals follow the PU and PD signals according to the value or level of the select signal.

The following of the Pump-Up signal and the Pump-Down signal with respect to the PU signal and the PD signal as just described is illustrated in the diagram 600A with the line thickness differential shown with the Pump-Up signal and the Pump-Down signal. More specifically, with regard to timing diagram 600A, initially the Pump-Up signal follows the PU signal until the rising edge of the PU signal at which time the select signal falls toggling the first MUX 70 and the second MUX 80 to select different inputs and as such the Pump-Up signal begins to follow the PD signal. Likewise, initially the Pump-Down signal follows the PD signal until the rising edge of the PU signal at which time the select signal falls toggling the first MUX 70 and the second MUX 80 to select different inputs and as such, the Pump-Down signal begins to follow the PU signal.

The timing diagram 600B represents the case where the monitored signal leads the reference signal and the initial values of the signals PU and PD are different to each other, while the reference signal and the monitored signal each has a logic "0" value. As discussed above in relation to FIG. 6A the real or actual phase difference the reference signal and the monitored signal is between the first illustrated rising edge of the monitored signal and the first illustrated rising edge of the reference signal. However, because the initial values of the signals PU and PD are different, the phase-frequency detector 30 detects a phase difference between the first illustrated rising edge of the reference signal and the second illustrated rising edge of the monitored signal. The timing diagram 600B illustrates the waveforms of the phase-frequency detector 30 when driving a charge-pump to cause the charge-pump to generate a net or effective output current $I_{cp}$ proportional to the phase difference between the reference signal and the monitored signal. In other words, the output current $I_{cp}$ generated by the charge-pump is proportional to half the difference in pulse widths between the Pump-Up signal and the Pump-Down signal.

Under the initial conditions depicted by the timing diagram 600B, the phase-frequency detector 30 initially determines the reference signal is faster than the monitored signal although the opposite is true and drives an associated charge-pump to source current $I_{cp}$ to increase the frequency of the monitored signal.

Further, the polarity of the current $I_{cp}$ produced by the associated charge-pump 100 starts in the opposite direction to what the smallest phase requires aligning the first rising edge of the monitored signal to the first rising edge of the reference signal. The phase-frequency detector 30 operate as discussed above in relation to FIGS. 3A-5B and as such, the charge-pump 100 generates a net or effective output current $I_{cp}$ proportional to the phase difference detected by the phase-frequency detector 30. The actual phase difference is represented by half the difference of pulse widths between the signals Pump-Up and Pump-Down.

In operation within a PLL, and given the initial conditions illustrated in FIG. 6B, the phase-frequency detector 30, starts correcting for the phase difference between the first rising edge of the reference signal and the second rising edge of the monitored signal. Nonetheless, those skilled in the art will appreciate that any rising edge of the reference signal is a valid reference point to which to align the rising edge of the monitored signal. Once that happens and from that new reference point of alignment, the pumping polarity of the output current $I_{cp}$ is according to the detected smallest phase different between the reference signal and the monitored signal. This transitory state is part of a normal PLL phenomenon known as "cycle slipping". Cycle slipping occurs when the frequency difference between the reference signal and the monitored signal is high enough that pumping, with correct polarity cannot stop the sliding of the monitored signal with respect to the reference signal within a given period. Although the polarity of the output current $I_{cp}$ switches during cycle slip the correct output current $I_{cp}$ polarity dominates over time and thus, the frequency difference between the reference signal and the monitored signal is eliminated.

As depicted in timing diagram 600B, the value of the PU signal is high at a logic "1" level until the first stage 40 detects the rising edge of the reference signal, at which time the PU signal falls from the logic "1" level to a logic "0" level. The value of the PU signal remains at the logic "0" level for one full period of the reference signal and rises to the logic "1" level on the next rising edge of the reference signal. This sequence repeats until interrupted. Thus, the pulse width of the PU signal is equal to one period of the reference signal.

In similar fashion, when the first stage 40 detects the rising edge of the monitored signal the PD signal rises from a logic "0" level to a logic "1" level and remains at the logic "1" level for one period of the monitored signal. When the first stage 40 detects a subsequent rising edge of the monitored signal, the PD signal transitions or falls from the logic "1" level to the logic "0" level. This sequence repeats until interrupted. Thus, the pulse width of the PD signal is equal to one period of the monitored signal.

The select signal produced by the selector circuits 64 or 64A transitions with the rising and falling edge of the PD signal under these operating conditions. That is, in timing diagram 600B the select signal initially begins at a logic "1" level and falls to a logic "0" level on the rising edge of the PD signal and again rises to a logic "1" level on the falling edge of the PD signal. The select signal controls operation of the first MUX 70 and the second MUX 80 to selectively drive the first output node 36 with the Pump-Up signal and to selectively drive the second output node 38 with the Pump-Down signal. As illustrated in timing diagram 600B, when the select signal has a logic "1" value the Pump-Up signal follows or is digitally equivalent to the PU signal and the Pump-Down signal follows or is digitally equivalent to the PD signal. When the select signal falls to a logic "0" level, the Pump-Up signal follows or is digitally equivalent to the PD signal and the Pump-Down signal follows or is digitally equivalent to the PU signal. Timing diagram 600B illustrates how the Pump-Up and Pump-Down signals follow the PU and PD signals according to the value or level of the select signal.

The following of the Pump-Up signal and the Pump-Down signal with respect to the PU signal and the PD signal as just described is illustrated in the diagram 600B with the line thickness differential shown with the Pump-Up signal and the Pump-Down signal. More specifically, with regard to timing diagram 600B, initially the Pump-Up signal follows the PU signal until the rising edge of the PD signal at which time the select signal falls toggling the first MUX 70 and the second MUX 80 to select different inputs and as such the Pump-Down signal begins to follow the PD signal. Likewise, initially the Pump-Down signal follows the PD signal until the rising edge of the PD signal at which time the select signal falls toggling the first MUX 70 and the second MUX 80 to select different inputs and as such, the Pump-Down signal begins to follow the PU signal.

Figure 7:
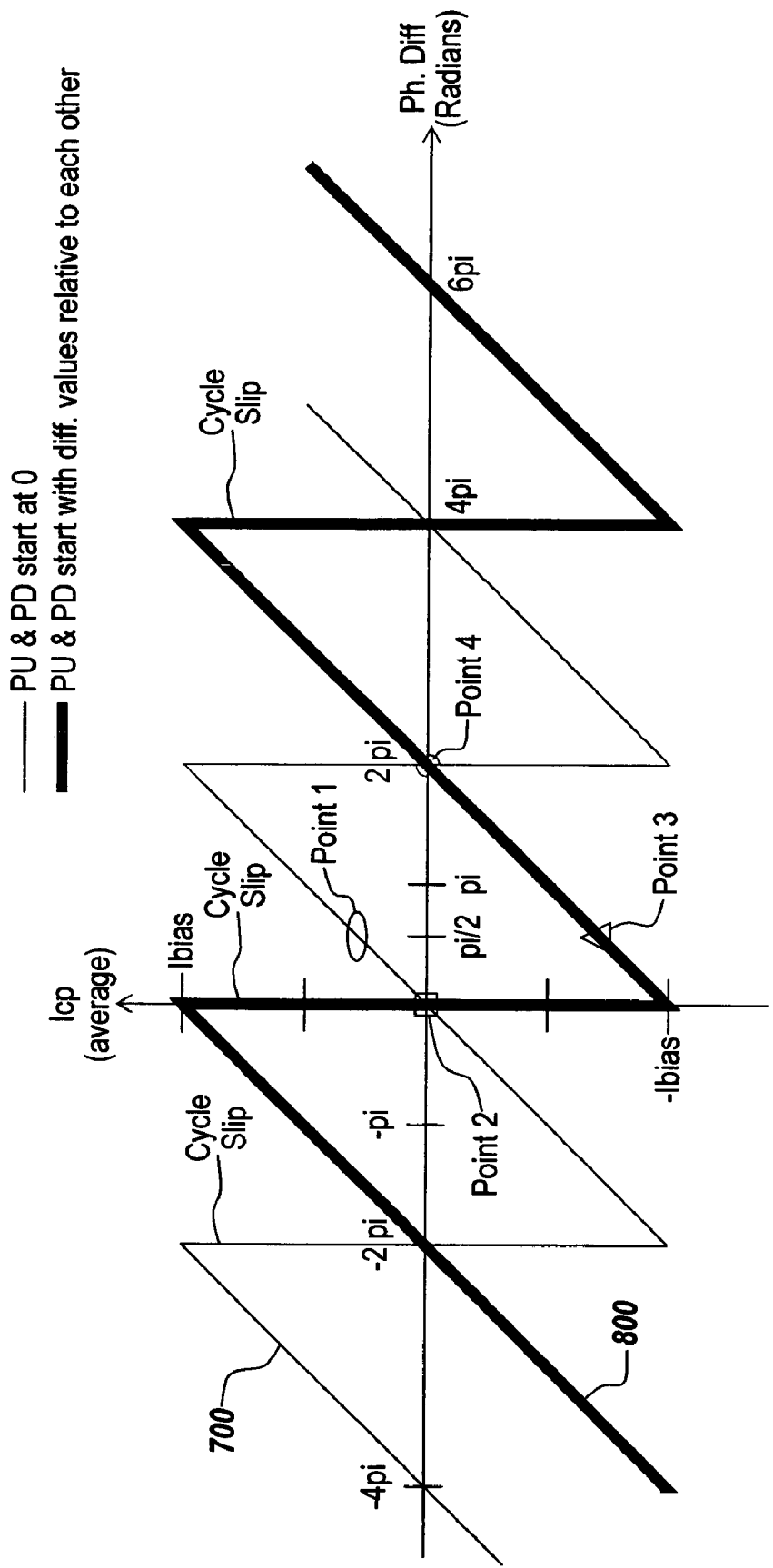
FIG. 7 are graphical representations of an average current versus phase difference of the phase-frequency detector of FIG. 3A when driving a charge-pump as shown in FIGS. 3B and 3C.

FIG. 7 is a graphical representation of the average output current $I_{cp}$ produced by the charge-pump 100 per reference cycle versus the phase difference (in radians) between the reference signal and the monitored signal detected by the phase-frequency detector 30. The graphical representation 700 depicts operation of the phase-frequency detector 30 to drive the charge-pump 100 in the case where the initial values of the signals PU and PD are logic "0" value, while the reference signal and the monitored signal each has a logic "0" value as illustrated in FIGS. 5A and 5B. As an example, Point 1 represents the reference signal leading the monitored signal by $\pi/2$ radians resulting in an average current equal to about half Ibias being sourced by the charge-pump. Point 2 is the zero-radian point and associated with the rising edge of the reference signal. As operation continues, the rising edge of the monitored signal becomes aligned with the zero-radian point. Those skilled in the art will appreciate that the PFD of the present invention is configurable to align any edge of the reference signal to any edge of the monitored signal.

The graphical representation 700 illustrates the correspondence between the phase difference between the reference signal and the monitored signal and the average current being produced by the charge-pump as well as the polarity of the average current for the case when PU and PD have the same logic value when both the reference and the monitored signals have a logic "0" value. FIGS. 5A and 5B illustrates the cases when PU and PD have a logic "0" value, but the graphical representation 700 would also apply to the cases where PU and PD each have a logic "1" value when the reference and monitored signals both have a logic "0" value.

In a PLL environment where the initial frequency difference between the reference and the monitored signals is small enough such that "cycle slipping" does not occur, the PLL drives the phase difference towards the zero radian point or Point 2. In other words, the PLL drives the phase difference towards the first or closest rising edge of the monitored signal. In the case when the frequency difference between the signals is large enough as to cause the slipping of one cycle then such slip occurs at $2\pi$ (i.e., the second rising edge of the reference signal) and the phase alignment occurs at $4\pi$ (i.e., the third rising edge of the reference signal) or Point 4. The cycle slip represents the point where the polarity of the output current $I_{cp}$ switches polarity from a positive $I_{cp}$ to a negative $I_{cp}$.

The graphical representation 800 corresponds to the case in which the initial digital values of PU and PD are different to each other and when both the reference and the monitored signals each have a logic "0" value as is the case in FIGS. 6A and 6B. Point 3 corresponds to the case of FIG. 6A when the reference signal leads the monitored signal by $\pi/2$ but the PFD identifies 2π instead of 0 as the reference point towards which the edge of the monitored signal should be aligned. As such, the PFD 30 drives or commands the charge-pump to sink current with an average current of 0.75Ibias, which is equivalent to the monitored signal leading the reference signal by 1.5π. In a PLL environment where the initial frequency difference between the reference and the monitored signals is small enough such that "cycle slipping" does not occur the phase difference is driven towards Point 4 or 2π. In the case of the frequency difference between the signals being large enough as to cause the slipping of one cycle then such slip occurs at 4π and the phase alignment occurs at 6π.

FIG. 8 illustrates an exemplarily state diagram depicting operation of the phase-frequency detector 30. The state diagram 850 has six states and the phase-frequency detector 30 transitions between states on either the rising edge of the reference signal or the rising edge of the monitored signal. From the legend provided U represents the value of the Pump-Up signal, D represents the value of Pump-Down signal, S represents the value of the selector signal, and ST represents the state number. Within each state, the value of the select signal is identified and the arrows identify when the Pump-Up and Pump-Down signals follow the PU and PD signals.

In the case where the initial values of the PU and PD signal are both logic "0" values and when both the reference and monitored signals have a logic "0" value and the reference signal leads the monitored signal as is the case in FIG. 5A. As such, then the phase-frequency detector 30 begins in State 1 where select has a logic "1" value causing Pump-Up to follow PU and Pump-Down to follow PD. At State 1, all four signals have a logic "0" value. From State 1 on the rising edge of the reference signal the phase-frequency detector transitions to State 2. In State 2, the value of the select signal is a logic "1" value causing Pump-Up to follow PU and Pump-Down to follow PD, the PU signal and the Pump-Up signal have a logic "1" value while the PD signal and the Pump-Down signal have a logic "0" value. On the rising edge of the monitored signal, the phase-frequency detector 30 transitions from State 2 to State 4. In State 4, the selector signal has a logic "0" value causing Pump-Up to follow PD and Pump-Down to follow PU, and the signals PU, PD, Pump-Up, and Pump-Down have a logic "1" value.

From State 4 and on the rising edge of the reference signal, the phase-frequency detector 30 transitions to State 5. In State 5, the selector signal remains at a logic "0" level causing Pump-Up to follow PD and Pump-Down to follow PU. Since at that state the PU signal has a logic "0" value and the PD signal has a logic "1" value then the logic value of the Pump-Up and Pump-Down signals is "1" and "0" respectively. On the rising edge of the monitored signal the phase-frequency detector 30 transitions from State 5 to State 1. Therefore the sequence of states followed by the phase-frequency detector 30 given the initial conditions of FIG. 5A is: State 1, State 2, State 4, State 5, and back to State 1.

In the case when the initial values of the PU and the PD signal are both logic "0" value while the reference and monitored signals are logic "0" value and the monitored signal leads the reference signal as is the case in FIG. 5B then the phase-frequency detector 30 begins in State 1 where select has a logic "1" value causing Pump-Up to follow PU and Pump-Down to follow PD. At State 1, all four signals have a logic "0" value. From State 1 on the rising edge of the monitored signal the phase-frequency detector transitions to State 3. In State 3 the value of the select signal is a logic "1" value causing Pump-Up to follow PU and Pump-Down to follow PD, the PU signal and the Pump-Up signal have a logic "0" value while the PD signal and the Pump-Down signal have a logic "1" value. On the rising edge of the reference signal, the phase-frequency detector 30 transitions from State 3 to State 4. In State 4, the selector signal has a logic "0" value causing Pump-Up to follow PD and Pump-Down to follow PU, and the signals PU, PD, Pump-Up, and Pump-Down have a logic "1" value.

From State 4 and on the rising edge of the monitored signal, the phase-frequency detector 30 transitions to State 6. In State 6, the selector signal remains at a logic "0" level causing Pump-Up to follow PD and Pump-Down to follow PU. Since at that state the PU signal has a logic "1" value and the PD signal has a logic "0" value then the logic value of the Pump-Up and Pump-Down signals is "0" and "1" respectively. On the rising edge of the reference signal the phase-frequency detector 30 transitions from State 6 to State 1. Therefore the sequence of states followed by the phase-frequency detector given the initial conditions of FIG. 5B is: State 1, State 3, State 4, State 6, and back to State 1.

In the case where the initial values of the PU signal and the PD signal are different to each other, while the reference signal and monitored signal each have a logic "0" value and monitored signal leads the reference signal, as is the case in FIG. 6B. Then the phase-frequency detector 30 starts in State 2 where the select signal has a logic "1" value, and the PU signal and the Pump-Up signal also have a logic "1" value. The PD signal and the Pump-Down signal have a logic "0" value. In State 2, the Pump-Up signal follows the PU signal and the Pump-Down signal follows the PD signal. On the rising edge of the monitored signal the phase-frequency detector 30 transitions to State 4. In State 4, the select signal has a logic "0" value the PU, PD, Pump-Up and Pump-Down signals all have a logic "1" value. In State 4, the Pump-Up signal follows the PD signal and the Pump-Down follows the PU signal. On the rising edge of the reference signal the phase-frequency detector 30 transitions to State 5. On the rising edge of the monitored signal the phase-frequency detector 30 transitions from State 5 to State 1. In State 1, the select signal has a logic "1" value the PU, PD, Pump-Up and Pump-Down signals all have a logic "0" value. In State 1, the Pump-Up signal follows the PU signal and the Pump-Down follows the PD signal. From State 1 and on the rising edge of the reference signal the phase-frequency detector 30 transitions to State 2. Therefore the sequence of states followed by the phase-frequency detector 30 given the initial conditions of FIG. 6B is: State 2, State 4, State 5, State 1, and back to State 2.

If the phase-frequency detector 30 starts in State 3 as in FIG. 6A (i.e., reference signal leads the monitored signal), the value of the select signal is a logic value "1", and the PD signal and the Pump-Down signal also have a logic "1" value. The PU signal and the Pump-Up signal both have a logic "0" value. In State 3, the Pump-Up signal follows the PU signal and the Pump-Down signal follows the PD signal. On the rising edge of the reference signal the phase-frequency detector 30 transitions from State 3 to State 4. In State 4, the select signal has a logic "0" value and the PU, PD, Pump-Up and Pump-Down signals all have logic "1" values. In State 4, the Pump-Down signal follows the PU signal and the Pump-Up signal follows the PD signal. On the rising edge of the monitored signal, the phase-frequency detector 30 transitions to State 6. In State 6, the select signal has a logic "0" value, and the PD signal and the Pump-Up signal have a logic "0" value. The PU signal and the Pump-Down signal have a logic "1" value. In State 6, the Pump-Up signal follows the PD signal and the Pump-Down signal follows the PU signal. Consequently, on the next rising edge of the reference signal the phase-frequency detector 30 transitions from State 6 to State 1. In State 1, the select signal has a logic "1" value the PU, PD, Pump-Up and Pump-Down signals all have a logic "0" value. In State 1, the Pump-Up signal follows the PU signal and the Pump-Down follows the PD signal. From State 1 and on the rising edge of the monitored signal the phase-frequency detector 30 transitions to State 3. Therefore the sequence of states followed by the phase-frequency detector 30 given the initial conditions of FIG. 6A is: State 3, State 4, State 6, State 1, and back to State 3.

The state diagram 850 also illustrates operation of the phase-frequency detector 30 when either the reference signal or monitored signal is missed or is not received. For example, if the phase-frequency detector 30 is in State 4 and detects a rising edge of the reference signal the phase-frequency detector 30 transitions to State 5. In State 5, if the phase-frequency detector 30 does not detect or misses a rising edge of the monitored signal but, instead detects another rising edge of the reference signal the phase-frequency detector 30 transitions back to State 4. In this manner, the phase-frequency detector 30 can transition between states if a signal is missed or not received to allow the phase-frequency detector 30 to try to recover proper operation once the missing edges return or again become detectable to the phase-frequency detector 30. Those skilled in the art will appreciate that in this manner and if the phase-frequency detector 30 forms a portion of a PLL, both the phase-frequency detector and the PLL have an opportunity to recover from the missed signal and continue with proper operation.

While the present invention has been described in reference to a preferred embodiment thereof, one skilled in the art will appreciate various changes in form and detail may be made without departing from the intended scope of the present invention as defined in the pending claims. For example, the phase-frequency detector 30 can remain in the same state if a reference signal or the monitored signal is lost or missed. Further, the logic "0" or "low" values and levels referred to throughout this text refer to voltage levels that represent a low logic value and the logic "1" or "high" levels and values referred throughout this text referred to a high logic value.

What is claimed is:

1. A phase-frequency detector comprising:
   a first stage responsive to an edge transition location of a first periodic signal having a first period received on a first input node and to an edge transition location of a second periodic signal having a second period received on a second input node to drive a first output node with a first output signal and to drive a second output node with a second output signal, wherein the first stage comprises, a first sequential logic device coupled to the first input node and a second sequential logic device coupled to the second input node, and a first inverter coupled between an output node of the first sequential logic device and a data input node of the first sequential logic device and a second inverter coupled between an output node of the second sequential logic device and a data input node of the second sequential logic device; and
   a second stage responsive to an edge transition location of the first output signal and to an edge transition location of the second output signal to selectively drive a first output node of the phase-frequency detector with a first output pulse and to drive a second output node of the phase-frequency detector with a second output pulse, the first output pulse and the second output pulse each having a pulse width related to the edge transition location of the first periodic signal relative to the edge transition location of the second periodic signal, the second stage comprising a selector circuit to select between the first output node of the first stage and the second output node of the second stage, the second stage further comprising a first multiplexor and a second multiplexor responsive to the selector circuit to select between the first output node of the first stage and the second output node of the first stage,
   wherein each of the edge transition locations of the first and second periodic signals and each of the edge transition locations of the first and second output signals represent a point in time at which a related signal edge transition occurs.

2. The phase-frequency detector of claim 1, wherein the selector circuit comprises a state machine.

3. The phase-frequency detector of claim 1, wherein at least one of the first or second sequential logic devices comprises an edge sensitive device.

4. The phase-frequency detector of claim 3, wherein an output pulse of the first sequential logic device has a pulse width substantially equal to the first period of the first periodic signal and an output of the second sequential logic device has a pulse width substantially equal to the second period of the second periodic signal.

5. The phase-frequency detector of claim 1, wherein a transition of the first periodic signal triggers a transition of the first output of the phase-frequency detector.

6. The phase-frequency detector of claim 1, wherein a transition of the second periodic signal triggers a transition of the second output of the phase-frequency detector.

7. A phase-locked loop circuit comprising:
   a voltage controlled oscillator (VCO) responsive to an analog control signal to produce a periodic output signal; and
   a phase-frequency detector responsive to a reference signal received on a first input node and a monitored signal received on a second input node to produce a first output signal on a first output node having a first pulse width and a second output signal on a second output node having a second pulse width, the phase-frequency detector comprising a first stage that comprises a first sequential logic device coupled to the first input node and a second sequential logic device coupled to the second input node, and a first inverter coupled between an output node of the first sequential logic device and a data input node of the first sequential logic device and a second inverter coupled between an output node of the second sequential logic device and a data input node of the second sequential logic device, the phase-frequency detector comprising a second stage that comprises a selector circuit to select between the first output node of the first stage and the second output node of the second stage, the second stage further comprising a first multiplexor and a second multiplexor responsive to the selector circuit to select between the first output node of the first stage and the second output node of the first stage;
   wherein one half of a difference in pulse widths of the first and second output signals represents a detected phase difference between the reference signal and the monitored signal.

8. The phase-locked loop circuit of claim 7 further comprising, a charge-pump responsive to the first output signal and the second output signal to produce a charge-pump current having an effective average value and polarity proportional to the detected phase difference between the reference signal and the monitored signal.

9. The phase-locked loop circuit of claim 7 further comprising, a charge-pump responsive to the first output signal and the second output signal to produce a charge-pump current having an effective average value and polarity proportional to the pulse width difference between the first output signal and the second output signal.

10. The phase-locked loop circuit of claim 8 further comprising, a loop filter configured to produce an analog control signal from the charge-pump current.

11. The phase-locked loop circuit of claim 7, wherein the monitored signal has a frequency proportional to an output of the VCO received by the phase-frequency detector.

12. The phase-locked loop circuit of claim 8, wherein the output signal with the larger pulse width controls a polarity of the current.

13. The phase-locked loop circuit of claim 9, wherein the output signal with the larger pulse width controls a polarity of the current.

14. A method of driving a charge-pump in a phase-locked loop to generate a current, the method comprising the steps of:
   detecting a phase difference between a reference signal and a monitored signal related to an output signal of a voltage controlled oscillator;
   generating in response to the detected phase difference a first pulse having a first pulse width and a second pulse having a second pulse width, the first pulse and the second pulse generated by a phase-frequency detector, the phase-frequency detector comprising a first stage that comprises a first sequential logic device coupled to the first input node and a second sequential logic device coupled to the second input node, and a first inverter coupled between an output node of the first sequential logic device and a data input node of the first sequential logic device and a second inverter coupled between an output node of the second sequential logic device and a data input node of the second sequential logic device, the phase-frequency detector comprising a second stage that comprises a selector circuit to select between the first output node of the first stage and the second output node of the second stage, the second stage further comprising a first multiplexor and a second multiplexor responsive to the selector circuit to select between the first output node of the first stage and the second output node of the first stage; and
   driving a charge-pump with the first and second pulse to generate an average output current, on a per-period basis, proportional to one-half of a pulse width difference between the first output pulse and the second output pulse.

15. The method of claim 14, wherein the pulse width difference between the first output pulse and the second output pulse represents twice the phase difference between the reference signal and the monitored signal.

16. The method of claim 14, wherein a polarity of the output current is determined by the output pulse having the larger pulse width.

* * * * *